United States Patent

Takeuchi et al.

[11] Patent Number: 5,997,671
[45] Date of Patent: Dec. 7, 1999

[54] METHOD FOR PRODUCING CERAMIC DIAPHRAGM STRUCTURE

[75] Inventors: Yukihisa Takeuchi, Nishi-kamo-gun; Tsutomu Nanataki, Toyoake; Katsuyuki Takeuchi, Nagoya, all of Japan

[73] Assignee: NGK Insulators, Ltd., Nagoya, Japan

[21] Appl. No.: 08/876,230

[22] Filed: Jun. 16, 1997

Related U.S. Application Data

[62] Division of application No. 08/555,865, Nov. 13, 1995.

[30] Foreign Application Priority Data

Nov. 16, 1994 [JP] Japan .................................. 6-281846

[51] Int. Cl.[6] .............................. B32B 31/26; H01L 41/08
[52] U.S. Cl. .................................. 156/89.11; 156/89.12; 156/256; 310/324
[58] Field of Search ............................ 156/89.11, 89.12, 156/256; 310/324, 328, 358

[56] References Cited

U.S. PATENT DOCUMENTS

| | | | |
|---|---|---|---|
| 4,635,079 | 1/1987 | Hubbard ................................. | 346/140 |
| 4,766,671 | 8/1988 | Utsumi et al. ......................... | 29/848 |
| 5,089,455 | 2/1992 | Ketcham et al. ..................... | 501/104 |
| 5,126,615 | 6/1992 | Takeuchi et al. ..................... | 310/330 |
| 5,210,455 | 5/1993 | Takeuchi et al. ..................... | 310/328 |
| 5,475,279 | 12/1995 | Takeuchi et al. ................... | 310/331 |
| 5,517,076 | 5/1996 | Takeuchi et al. ..................... | 310/358 |
| 5,545,461 | 8/1996 | Takeuchi et al. . | |
| 5,600,197 | 2/1997 | Takeuchi et al. ..................... | 310/328 |
| 5,634,999 | 6/1997 | Takeuchi et al. . | |
| 5,767,612 | 6/1998 | Takeuchi et al. ..................... | 310/324 |
| 5,798,168 | 8/1998 | Takeuchi et al. . | |
| 5,809,626 | 9/1998 | Takeuchi et al. . | |

FOREIGN PATENT DOCUMENTS

| | | |
|---|---|---|
| 0 667 647 A1 | 8/1995 | European Pat. Off. . |
| 0 671 772 A1 | 9/1995 | European Pat. Off. . |
| 60-111600 | 6/1985 | Japan . |
| 63-292032 | 11/1988 | Japan . |
| 4-280875 | 10/1992 | Japan . |
| 5-49270 | 2/1993 | Japan . |

Primary Examiner—Curtis Mayes
Attorney, Agent, or Firm—Kubovcik & Kubovcik

[57] ABSTRACT

A ceramic diaphragm structure includes a ceramic substrate having at least one window portion, and a thin ceramic diaphragm plate laminated so as to cover the window portion, wherein the ceramic diaphragm structure is unitarily formed so that the thin ceramic diaphragm portion is protruded in the direction opposite to the window portion, and a ceramic connecting layer connects the thin ceramic diaphragm plate to the ceramic substrate. The ceramic diaphragm structure has a high resonance frequency, an enhanced strength, an excellent quality and a high reliability.

4 Claims, 5 Drawing Sheets

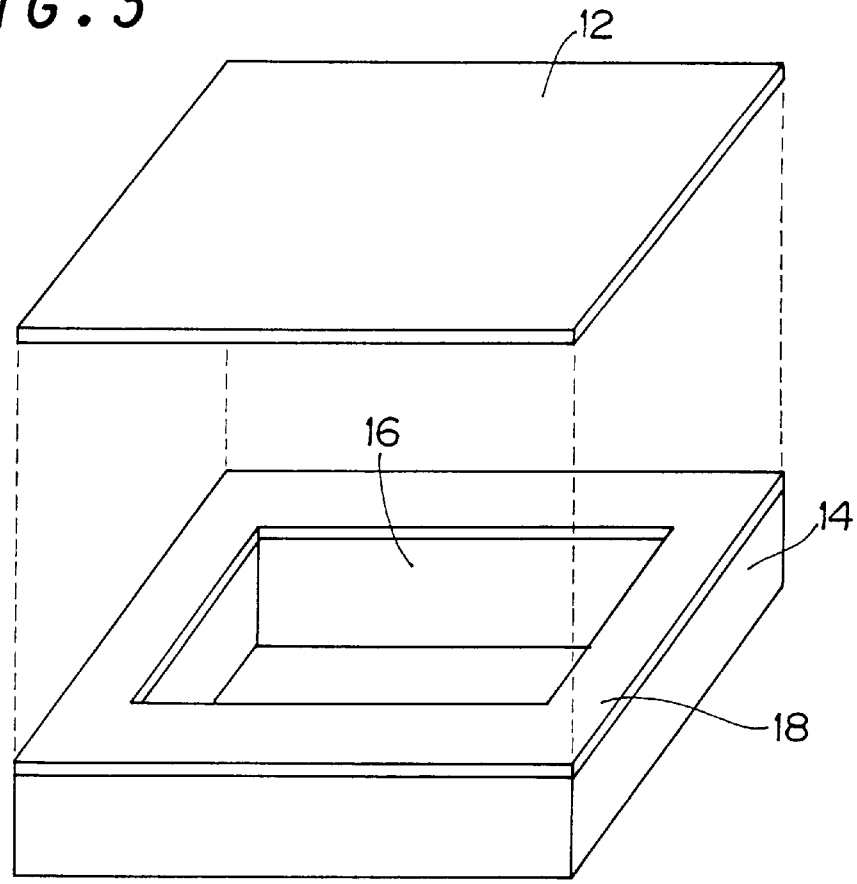
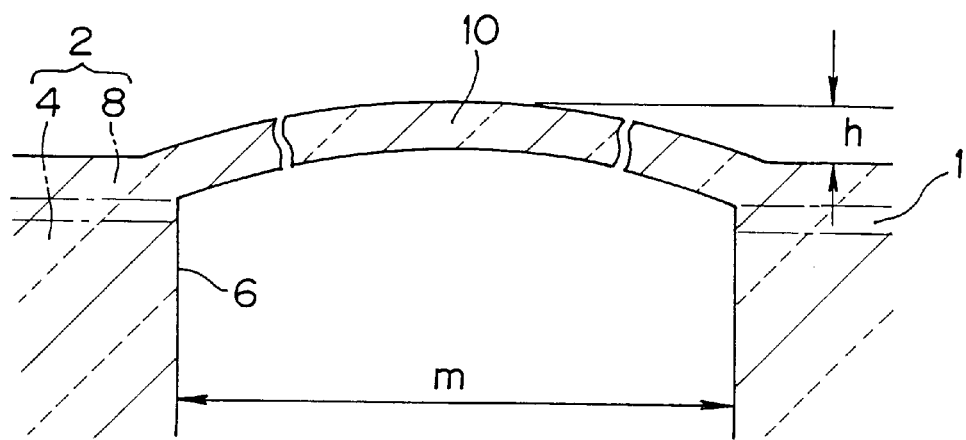

METHOD FOR PRODUCING CERAMIC DIAPHRAGM STRUCTURE

This application is a division of application Ser. No. 08/555,865, filed Nov. 13, 1995.

BACKGROUND OF THE INVENTION AND RELATED ART STATEMENT

The present invention relates to a ceramic diaphragm structure and a method for manufacturing the ceramic diaphragm structure. Particularly, the present invention relates to a ceramic diaphragm structure having a specific configuration of a thin diaphragm portion and a method for manufacturing such a ceramic diaphragm advantageously.

There has conventionally been used a diaphragm structure as a member or the like constituting various kinds of sensors. Attention has recently been paid to the diaphragm structure as a member constituting a piezoelectric/electrostrictive actuator. The diaphragm structure includes a substrate having at least one window portion and a thin diaphragm plate formed of flexible, filmy material covering the window portion. When the diaphragm structure is used as a member constituting a sensor, the diaphragm structure is constituted so that a bending displacement caused by an object to be measured by a diaphragm portion is detected by an appropriate means. When the diaphragm structure is used as a member constituting a piezoelectric/electrostrictive actuator, the diaphragm structure is used under the condition that the diaphragm portion is transformed by a piezoelectric/electrostrictive element, causing a pressure in a hollow portion formed inside the diaphragm structure.

Such a diaphragm structure is produced by unitarily combining a substraite with a filmy member which gives a diaphragm. In view of a reliability, thermal resistance, anti-corrosive ability and the like, it was considered to constitute such a diaphragm structure by unitarily firing a ceramic. The present inventors have disclosed in Japanese Patent Laid-Open 63-292032 and Japanese Patent Laid-Open 5-49270 a pressure detecting apparatus or a piczoelectric/electrostrictive actuator, in which a ceramic diaphragm structure obtained by unitarily firing was used.

Such a ceramic diaphragm structure is generally obtained by firing a unitary laminate composed of (1) a ceramic green substrate having a predetermined configuration and a window portion and (2) a thin ceramic green sheet covering the window portion. However, the present inventors found that there are some problems during a unitary firing operation that a diaphragm portion, which is formed of a ceramic green sheet and positioned on the window portion of the ceramic green substrate, deforms into a depressed shape (The shape that a diaphragm portion protrudes in the opposite direction of the window portion is a protruded shape.) or has cracks. Such a depression or a crack in the diaphragm portion hinders a function or an operation of the diaphragm and makes the reliability of the diaphragm deteriorate.

Additionally, in the case of such a ceramic diaphragm structure, it is usually tried to make a diaphragm portion plane. However, in such a plane diaphragm portion, there are some problems. It is difficult to increase the resonance frequency and to thin the portion because the strength is not satisfactory. Further, an electrode film or a piezoelectric/electrostrictive film formed on the surface cannot be satisfactorily sintered.

Therefore, the present inventors have previously disclosed a thin ceramic diaphragm structure having a high reliability in Japanese Patent Application 6-122733. The diaphragm structure is free from a depression, a crack, or the like in a diaphragm portion, and a resonance frequency of the diaphragm can be increased. Further, the diaphragm structure is excellent in strength, and various films formed on the surface of the diaphragm portion can be satisfactorily sintered without being hindered.

The ceramic diaphragm structure was produced by controlling a difference of sintering speed and a firing shrinkage rate between a ceramic green substrate and a thin ceramic green sheet covering a window portion. However, when a substrate is composed of many structures each having a plurality of window portions, a diaphragm portion sometimes has a depression or has a variance of the height of protrusion.

SUMMARY OF THE INVENTION

The present invention has been achieved under such circumstances as a background. An object of the invention is to provide a thin ceramic diaphragm structure having a high reliability. Even if the diaphragm structure has a substrate composed of many diaphragm structures each having a plurality of window portions (diaphragm portions), the diaphragm portions do not have any depression or crack, and a resonance frequency can be increased. The diaphragm portions are excellent in strength, and sintering of various kinds of films formed on the surface of the diaphragm portions. Another object of the invention is to provide a method for producing such a diaphragm structure advantageously.

One aspect of the invention is to provide a ceramic diaphragm structure comprising: a ceramic substrate having at least one window portion; and a thin ceramic diaphragm plate laminated so as to cover the window portion, wherein the ceramic diaphragm structure is unitarily formed so that the thin ceramic diaphragm portion is protruded in the direction opposite to the window portion, and a ceramic connecting layer connects the thin ceramic diaphragm plate to the ceramic substrate.

The ceramic diaphragm plate is preferably composed of a material having, as a main component, a stabilized zirconia, a partially stabilized zirconia, alumina, or a mixture thereof.

An average crystal grain size of each of the ceramic substrate, the ceramic diaphragm plate, and the ceramic connecting layer is desirably 5 $\mu$m or less. Further the diaphragm portion has a thickness of 30 $\mu$m or less. The ceramic connecting layer has a thickness of 50 $\mu$m or less. The diaphragm portion is composed of a dense material having a relative density of at least 90%.

Another aspect of the present invention is to provide a method for producing a ceramic diaphragm structure, comprising the steps of: (a) preparing a ceramic green substrate; (b) forming a ceramic green connecting layer having a predetermined thickness on the ceramic green substrate; (c) forming at least one window portion on the ceramic green substrate on which the ceramic green connecting layer is formed; (d) preparing a thin ceramic green sheet having a predetermined thickness; (c) preparing a unitarily formed laminate by laminating the ceramic green sheet on the ceramic green substrate having at least one window portion so as to cover the window portion in the side of ceramic green connecting layer; and (f) firing the laminate to obtain a unitarily sintered body in which a thin diaphragm portion is formed in a window portion of the ceramic green substrate, and simultaneously with the firing of the laminate, the diaphragm portion is protruded in the direction opposite to the window portion.

In such a method, the ceramic green substrate, the ceramic green sheet, and the ceramic green connecting layer are adjusted so as to have a mid-sintering temperature and a shrinkage rate satisfying the formulae:

$S(\text{substrate}) - S(\text{sheet}) \geq -0.08\{T(\text{substrate}) - T(\text{sheet})\} - 1 \quad 0 \leq T(\text{substrate}) - T(\text{sheet}) \leq 300 \quad S(\text{substrate}) - S(\text{sheet}) \leq 20$ and $300 \geq T(\text{substrate}) - T(\text{connecting layer}) \geq 20$ or $-350 \leq T(\text{substrate}) - T(\text{connecting layer}) \leq -50$

[S(substrate) and S(sheet) denote shrinkage rates (%) in the direction along the surfaces when the ceramic green substrate and the ceramic green sheet are independently fired at the same temperature as a firing temperature of the laminated body. T(substrate), T(sheet), and T(connecting layer) denote firing temperatures (° C.) when a shrinkage rate (%) in the direction along the surface reaches 70% when the ceramic green substrate, the ceramic green sheet, and the ceramic green connecting layer are independently fired at the same temperature as a firing temperature of the laminated body.]

The ceramic green sheet is preferably formed of a material which contains a completely stabilized zirconia material, a partially stabilized zirconia material, alumina material or a material containing, as a main component, a mixture thereof, an average particle diameter of each material ranging from 0.05 to 1.0 μm. The material may contain 30% or less of a sintering aid, for example, clay, silica, magnesia, transitional metal oxide, or the like.

BRIEF DESCRIPTION OF THE DRAWINGS

FIG. 3 is an explanatory view showing an embodiment of combining a ceramic green sheet with a ceramic green substrate for producing a diaphragm structure shown in FIG. 1.

FIG. 4 is a partial explanatory cross-sectional view showing a magnified important portion of the diaphragm structure shown in FIG. 1.

DETAILED DESCRIPTION OF THE INVENTION

Figure 1:
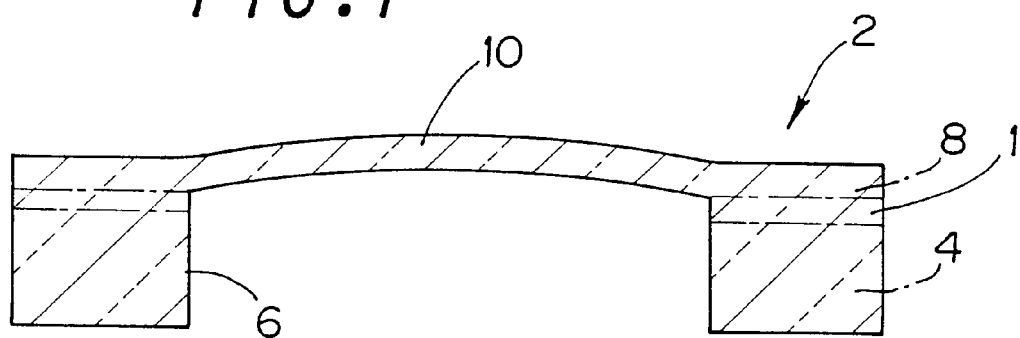
FIG. 1 shows an embodiment of a basic structure of a thin zirconia diaphragm structure according to the present invention.
Figure 2:
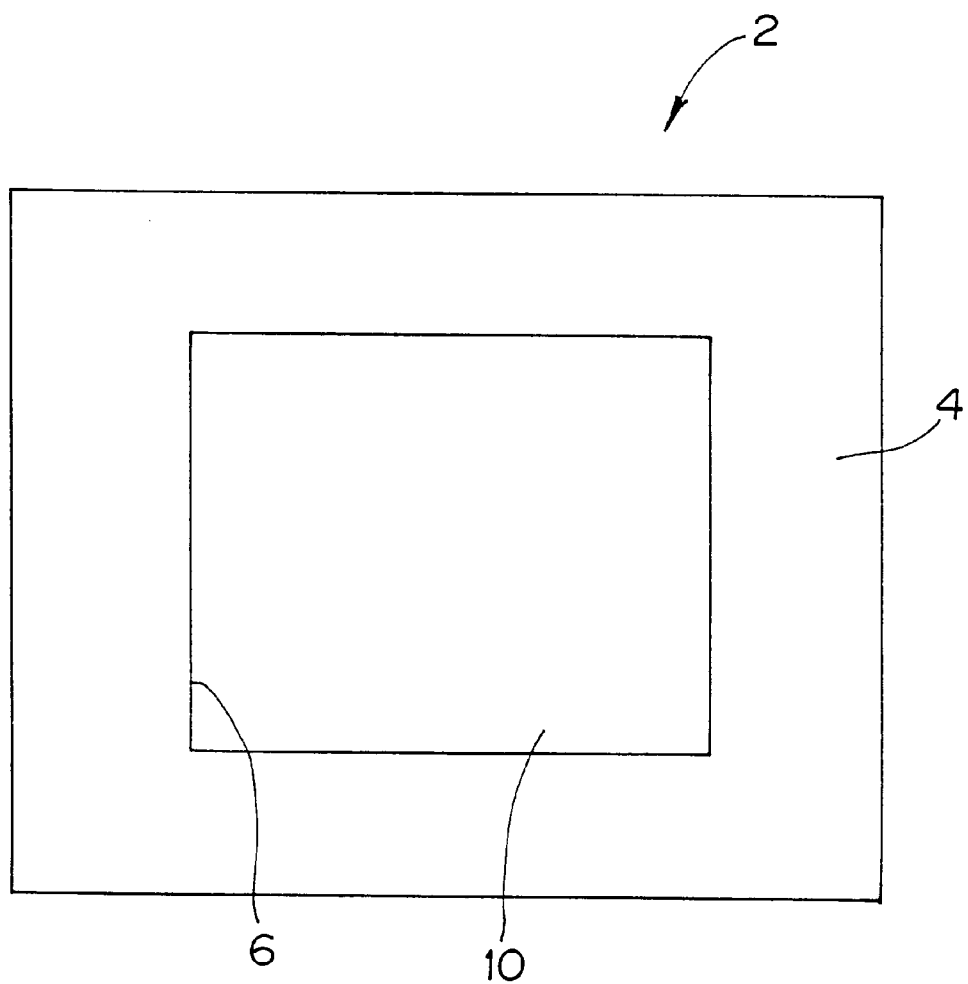
FIG. 2 is a bottom view showing a base of the diaphragm structure shown in FIG. 1.

In the present invention, a diaphragm portion is formed to be protruded outside in a ceramic diaphragm structure in which a thin diaphragm portion is unitarily formed so as to cover a window portion provided in the ceramic substrate. An embodiment of a ceramic diaphragm structure of the present invention is shown in FIGS. 1 and 2. Incidentally, the ceramic diaphragm structure of the embodiment has only one window portion.

That is, in the figures, a diaphragm structure 2 is unitarily composed of a ceramic substrate 4 as a supporter having a predetermined thickness having a rectangle window portion 6 having a predetermined size and a thin diaphragm plate 8 covering the window portion 6, the plate being put on one side of a surface of the ceramic substrate 4. A portion of the diaphragm plate 8 corresponding to the window portion 6 of the ceramic substrate 4 is a diaphragm portion 10. Such a diaphragm structure 2 is produced as shown in FIG. 3. A thin ceramic green sheet 12 gives a ceramic diaphragm plate 8. A ceramic green substrate 14 on which a ceramic green connecting layer 18 is formed gives a ceramic substrate 4. A thin ceramic green sheet 12 is put on the ceramic green substrate 14 so that the sheet 12 covers a window portion 16 so as to be subjected to a thermal press-fitting to obtain a unitarity laminated body. The unitarily laminated body is fired so as to obtain a ceramic diaphragm structure 2. Incidentally, the ceramic green sheet 12 and the ceramic green substrate 14 may be formed by laminating a plurality of sheet components or substrate components, respectively. The shape of the window portion 6 of the diaphragm structure 2, in other words, the shape of the diaphragm portion 10, is a rectangular in the figures. However, the shape is not limited to a rectangular, and any shape can be suitably selected, for example, a circle, a polygon, an oval, or the like, or a combination thereof.

In the present invention, the diaphragm structure 2 is constituted so that a diaphragm portion 10 is protruded outside, in other words, opposite to the window portion 6 so as to have a curved shape, which removes some defects such as occurrence of a depression or a crack and gives advantages which could not be obtained by a flat-shaped diaphragm portion 10, for example, an increase of a resonance frequency, an improvement of a strength against an external force, an avoidance of hindering a film formed on the outer surface of the diaphragm portion 10 from sintering. Therefore, a use of the diaphragm structure 2 has been remarkably enlarged. Since a resonance frequency f is proportional to $(H/A^2) \sqrt{(E/\rho)}$. where, 2A denotes an outer diameter of the diaphragm plate 8, H denotes height of protrusion, E denotes Young's modulus of a material, and ρ denotes a density of a material, a resonance frequency f can be changed arbitrarily by adjusting a height of a protrusion. Specifically, when a height of a protrusion is increased, rigidity can be increased even if a thin diaphragm plate 8 is used, and a resonance frequency f is increased.

In this diaphragm structure 2, a protruded amount is determined depending on a use of the diaphragm structure 2. Generally, in order to obtain a diaphragm structure having a sufficient effect described above, a rate y of protrusion [y=(h/m)×100] is 1 or more. Here, "m" denotes the shortest dimension passing through the center of the window portion 6 in a ceramic substrate, and "h" is a protruded amount around the center of the diaphragm portion 10, in other words, a maximum amount of protrusion. Though an upper limit of a rate y of protrusion is suitably determined, the upper limit is generally about 50%.

In the diaphragm structure 2 according to the present invention, materials for the ceramic substrate 4, the ceramic diaphragm plate 8, and a ceramic connecting layer 1 can be suitably selected from various known ceramic materials.

Among them, the ceramic diaphragm plate 8 is generally formed of a material containing, as a main component, a stabilized zirconia, a partially stabilized zirconia, alumina, mullite, beryllia, spinel, titania, aluminum nitride, silicon nitride, or a mixture thereof. Among them, the ceramic diaphragm plate 8 is desirably formed of a material containing, as a main component, a stabilized zirconia, a partially stabilized zirconia, alumina, or a mixture thereof. Particularly, a preferable material contains as a main component a partially stabilized zirconia formed of a tetragonal crystal or mixed crystal phases containing at least two kinds of crystal phases selected from a tetragonal crystal, a cubic crystal, and a monoclinic crystal as the present inventors disclosed in Japanese Patent Laid-Open 5-270912. A diaphragm plate 8 formed of such a material not only has excellent properties of high strength, high thermal resistance, and high corrosion resistance, but also is thin and flexible. Therefore, such a diaphragm plate 8 can give an effective diaphragm structure. Incidentally, in order to realize a unitary structure of a diaphragm structure 2, a ceramic substrate 4 and a ceramic connecting layer 1 are desirably formed of an aforementioned material for a ceramic diaphragm plate 8. However, a ceramic material such as a glass ceramic, cordierite, or the like may be used for a ceramic substrate 4 or a ceramic connecting layer 1.

Further, a ceramic constituting a ceramic substrate 4, a ceramic diaphragm plate 8 (diaphragm portion 10), and a ceramic connecting layer 1 preferably have an average crystal grain size of generally 5 $\mu$m or less, desirably 3 $\mu$m or less, more desirably 1 $\mu$m or less in view of mechanical strength. A ceramic diaphragm plate 8 gives a thin diaphragm portion 10 at a window portion 6 of a ceramic substrate 4. A ceramic diaphragm plate 8 desirably has a thickness of 30 $\mu$m or less, particularly preferably 3–20 $\mu$m in view of a vibration property. Further, a ceramic diaphragm plate 8 has a relative density (bulk density/theoretical density) of preferably 90% or more, more preferably 95% or more, furthermore preferably 98% or more in view of material properties such as strength, Young's modulus, and the like.

A ceramic connecting layer 1 preferably has a thickness of 50 $\mu$m or less. When a ceramic connecting layer is too thick, it affects the protruded shape of a diaphragm portion.

Incidentally, though a thickness of a ceramic substrate 4 is preferably 50 $\mu$m in view of production, it can be suitably selected depending on the object of use of a ceramic substrate 4. A degree of sintering of a ceramic substrate 4 constituting a diaphragm structure 2 is not particularly limited, either, and is determined depending on the object of use of diaphragm structure 2. A ceramic substrate 4 may have a multi-layer structure. If a ceramic substrate 4 is formed of a ceramic material similar to that of a diaphragm plate 8, the diaphragm structure is advantageous in reliability or the like between laminated surfaces.

A ceramic diaphragm structure 2 can be produced by various means on the basis of knowledge of a person of ordinary skill. Particularly, a method having the following (a)–(f) steps is employed as one of advantageous methods for the present invention.

First, In (a) step, a ceramic green substrate 14 is prepared as shown in FIG. 3. In (b) step, a ceramic green connecting layer 18 having a predetermined thickness is formed on the ceramic green substrate 14. In (c) step, at least one window portion 16 is formed in the ceramic green substrate 14 on which the ceramic green connecting layer 18 is formed. In (d) step, a thin ceramic green sheet 12 having a predetermined thickness is prepared.

Incidentally, the aforementioned ceramic materials are suitably used for producing a ceramic green substrate 14, a ceramic green connecting layer 18, and a ceramic green sheet 12. Among them, a ceramic green sheet 12 is formed of a material having an average particle diameter of 0.05–1.0 $\mu$m in a form of powder and containing as a main component a stabilized zirconia, a partially stabilized zirconia, alumina, or a mixture thereof, or a material containing such components after firing. In a ceramic material, a binder, a plasticizer, a dispersant, a sintering aid, an organic solvent, and the like are added to prepare a slurry or a paste in a conventional way. A ceramic green substrate 14 and a ceramic green sheet 12 each having a predetermined thickness are formed of the slurry or the paste by conventionally known means such as doctor blading, calendaring, printing, reverse roll coater method, or the like. Then, if necessary, a ceramic green substrate 14 and a ceramic green sheet 12 are subjected to processing such as cutting, die cutting, or the like, or laminating a plurality of pieces so as to obtain a ceramic green substrate 14 and a ceramic green sheet 12 each having a predetermined shape and a predetermined thickness. A ceramic green connecting layer 18 is formed on the ceramic green substrate 14 by printing or painting using the aforementioned slurry or paste. Incidentally, there may be adopted a method for laminating a ceramic green connecting layer 18, in which a ceramic green sheet is first formed as well as the ceramic green substrate 14 and a ceramic green sheet 12, and then laminating the ceramic green sheet on the ceramic green substrate 14. The ceramic green connecting layer 18 can be laminated at once in (e) step.

Thus prepared ceramic green sheet 12 is laminated to form a laminated body in the next step (e). That is, a thin ceramic green sheet 12 is laminated on the aforementioned ceramic green substrate 14 so as to cover a window portion 16 of the ceramic green substrate 14. The ceramic green sheet is then subjected to pressing into contact with the ceramic green substrate 14 or the like so as to obtain a unitarily laminated body.

After that, in (f) step, the laminated body is fired so as to be a unitarily sintered body. In this process, a thin diaphragm portion 10 is formed at the window portion 16 of the ceramic green substrate 14. The diaphragm portion 10 is protruded outside opposite to the window portion 16 or 6 so as to has a curved shape simultaneously with the firing of the laminated body. Thus, there is obtained a ceramic diaphragm structure 2 shown in FIGS. 1 and 4. Incidentally, the firing temperature is within the range of generally 1200–1700° C., preferably 1300–1600° C.

In order to make the diaphragm portion protruded outside in a curved shape simultaneously with the firing of the laminated body consisting of a ceramic green sheet 12, a ceramic green substrate 14, and a ceramic green connecting layer 18; a ceramic material, a particle diameter of a powder material, additives such as at binder, a dispersant, a sintering aid, and the amount thereof are selected. In addition, conditions for mixing the materials for obtaining a slurry or a paste and firing temperature are controlled, thereby controlling a sintering speed and a firing shrinkage rate of the ceramic green sheet 12, the ceramic green substrate 14, and the ceramic green connecting layer 18 so that the diaphragm portion 10 formed of the ceramic green sheet 12 is protruded outside in a curved shape upon firing.

Particularly, in the present invention, the ceramic green sheet 12, the ceramic green substrate 14, and the ceramic green connecting layer 18 are adjusted so as to have a mid-sintering temperature and a shrinkage rate satisfying the following formulae (a):

$$S(\text{substrate})-S(\text{sheet})\geq -0.08\{T(\text{substrate})-T(\text{sheet})\}-1\ 0\leq T(\text{substrate})-T(\text{sheet})\leq 300\ S(\text{substrate})-S(\text{sheet})\leq 20$$

and $$-300\geq T(\text{substrate})-T(\text{connecting layer})\geq 20$$

or $$-350\leq T(\text{substrate})-T(\text{connecting layer})\leq -50$$

[S(substrate) and S(sheet) denote shrinkage rates (%) in the direction along the surfaces when the ceramic green substrate and the ceramic green sheet are independently fired at the same temperature as a firing temperature of the laminated body. T(substrate), T(sheet), and T(connecting layer) denote firing temperatures (° C.) when a shrinkage rate (%) in the direction along the surfaces reaches 70% when the ceramic green substrate, the ceramic green sheet, and the ceramic green connecting layer are independently fired at the same temperature as a firing temperature of the laminated body.]

By this adjustment, a diaphragm portion is protruded outside simultaneously with the firing of a laminated body consisting of a ceramic green substrate 14, a ceramic green sheet 12, and a ceramic green connecting layer 18.

In the aforementioned formulae (a), the shrinkage rate in a predetermined direction on the surface of the diaphragm structure can be expressed by a formula: [(Length before firing−Length after firing)/Length before firing]×100 (%). A temperature when a shrinkage rate on the surface reaches 70% means a temperature when the shrinkage rate of the diaphragm structure reaches 70% of the shrinkage rate S (i.e., 0.7 S), the shrinkage rate S being obtained by calculating from the aforementioned formula when a green substrate, a green sheet, and a green connecting layer are independently fired at the same temperature as the firing temperature for the aforementioned laminated body. That is, T is a measure for observing sinterability. It is required that a sintering speed of a thin ceramic green sheet 12 is almost the same as or higher than that of a ceramic green substrate 14. Even if the requirement is satisfied, a diaphragm portion sometimes has a protruded shape or a flat shape depending on a shrinkage rate S at a firing temperature for obtaining a diaphragm structure. Therefore, it is also required that the conditions satisfy the formulae (a) showing a correlation between S and T. Further, it is required to satisfy one of the formulae showing a correlation between T(substrate) and T(connecting layer) in the formulae (a). The formulae each shows that a sintering speed of a ceramic green connecting layer is higher or lower than that of a ceramic green substrate for forming an excellent protruded shape when a substrate having a great number of diaphragm structures each having a plurality of window portions is formed.

When a sinterability of a ceramic green sheet 12 is too much different from that of a ceramic green substrate 14, in other words, when a value of T(substrate)−T(sheet) is higher than 300, the protruded shape becomes unstable or cracks are caused. S means a shrinkage rate when each sheet is independently fired at a firing temperature at which a diaphragm structure is unitarily fired. When shrinkage rates are too much different from each other, i.e., when a value of S(substrate)−S(sheet) is higher than 20, there happens a problem that the diaphragm structure gains a large curvature after firing that the diaphragm plate 8 has cracks.

When a sinterability of a ceramic green substrate 14 is too much different from that of a ceramic green connecting layer 18, in other words, when a value of T(substrate)−T(connecting layer) is larger than 300 or smaller than−350, there arises a problem that a protruded shape becomes unstable, that cracks are caused, or that the diaphragm structure gains too large curvature.

In a method for manufacturing ceramic diaphragm structure according to the aforementioned present invention, in view of a stability of a protruded shape of diaphragm portion, a degree of curvature of the structure, a stress remaining in a diaphragm plate, or the like, a ceramic green sheet 12 and a ceramic green substrate 14 are adjusted so as to satisfy the following formulae (b):

$$S(\text{substrate})-S(\text{sheet})\geq -0.08\{T(\text{substrate})-T(\text{sheet})\}+0.8$$
$$10\leq T(\text{substrate})-T(\text{sheet})-\leq 200\ S(\text{substrate})-S(\text{sheet})\leq 10$$

More preferably, a ceramic green sheet 12 and a ceramic green substrate 14 are adjusted so as to satisfy the following formulae (c):

$$S(\text{substrate})-S(\text{sheet})\geq -0.08\{T(\text{substrate})-T(\text{sheet})\}+0.8$$
$$10\leq T(\text{substrate})-T(\text{sheet})\leq 100\ S(\text{substrate})-S(\text{sheet})\leq 5$$

In a method in which a substrate having a great number of diaphragm structures each having a plurality of window portions is formed, in view of a stability of a protruded shape of a diaphragm portion, a stress remaining in a diaphragm plate after firing, or the like, a ceramic green substrate 14 and ceramic green connecting layer 18 are adjusted so as to satisfy the following formulae (d):

$$30\leq T(\text{substrate})-T(\text{connecting layer})\leq 200$$

or $$-200<T(\text{substrate})-T(\text{connecting layer})\leq -80$$

more preferably, $$30\leq T(\text{substrate})-T(\text{connecting layer})\leq 130$$

or $$-200\leq T(\text{substrate})-T(\text{connecting layer})\leq -100$$

A thin ceramic diaphragm structure 2 according to the present invention is thus obtained. Since the diaphragm structure 2 does not have any depression or crack in the diaphragm portion 10, the diaphragm structure has high quality and high reliability and is excellent in strength, and can have a high resonance frequency. Further, a film formed on the outer surface of the diaphragm portion 10 is suitably sintered. Therefore, the diaphragm portion 10 can be used for various uses such as sensor, actuator, or the like. In addition, the ceramic diaphragm structure can he applied to a portion of, for example, an apparatus, a pipe, or the like, which is subjected to severe corrosive conditions, so as to be used as a pressure sensor having a corrosion resistance which monitors inner pressure in combination with various kinds of detecting means such as a distortion gauge. Further, the diaphragm structure can be used, in combination with a resource of driving, force such as an air pressure and an extruding stick, as an actuator having, a large amount of displacement though a frequency is low.

Figure 5:
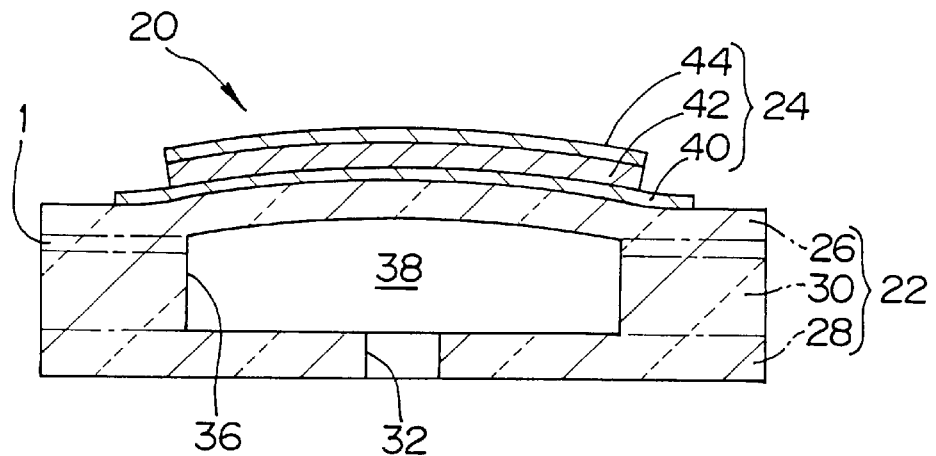
FIG. 5 is a cross-sectional view showing an embodiment of a piezoelectric/electrostrictive film type of element in which a thin ceramic diaphragm structure of the present invention is used.
Figure 6:
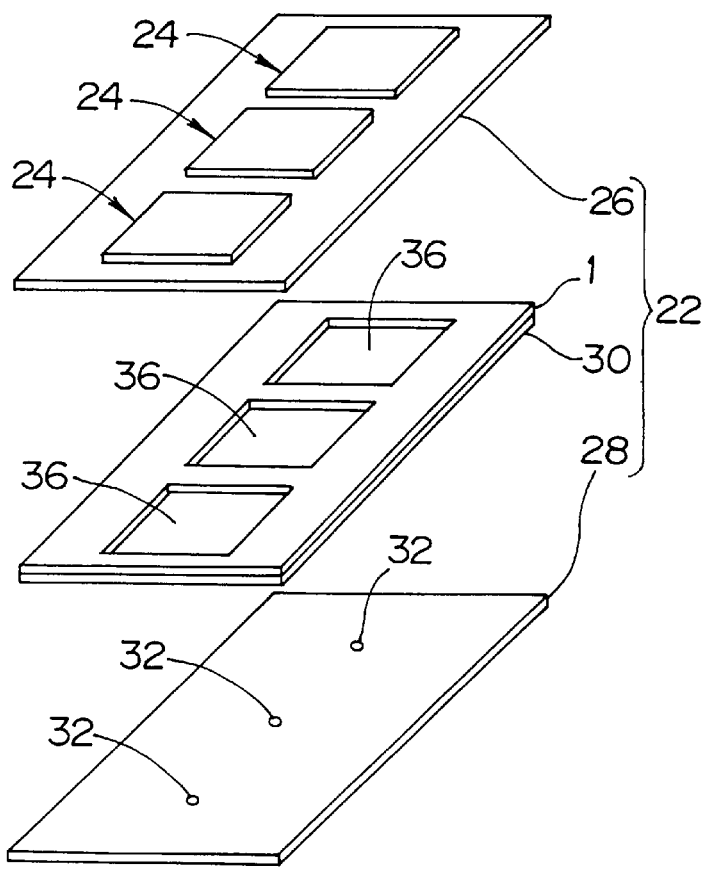
FIG. 6 is a perspective view of a decomposed piezoelectric/electrostrictive film type of element shown in FIG. 5.

A thin ceramic diaphragm structure according, to the present invention can be advantageously used as a piezoelectrie/electrostrietive film type of element by being provided with a piezoelectric/electrostnective operating, portion on one surface of a diaphragm Portion. Particularly, the diaphragm structure can be advantageously used as a piezoelectric/electrostrictive film type of element which generates or detects a bending displacement or a force, for example, unimorph type which is used for an actuator, a filter, a display, an accelerating sensor, an impact sensor, an ultrasonic sensor, an angular velocity sensor, a transformer, a microphone, a sound generator such as a speaker, a discriminator, a vibrator or an oscillator for power or communication. FIG. 5 roughly shows a piezoelectric/electrostrictive film type of actuator having a thin ceramic diaphragm structure according to the present invention. FIG. 6 shows a perspective view of the decomposed actuator. The figures show that a piezoeleetric/electrostrictive film element 20 is formed by unitarily connecting a diaphragm structure 22 with a piezoelectric/electrostrictive operating portion 24 disposed on the outer surface of the diaphragm portion. The piezoelectric/electrostrictive operating portion 24 makes a diaphragm portion of the diaphragm structure 22 have a bending displacement according to an applied voltage.

Figure 7:
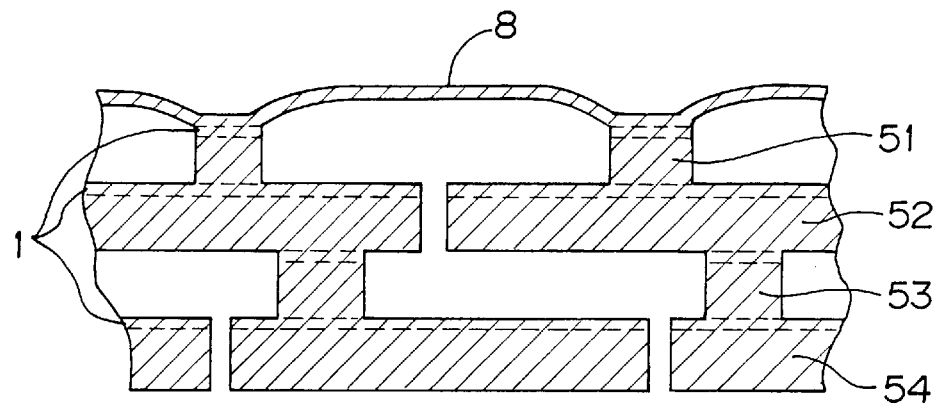
FIG. 7 is a cross-sectional view of a diaphragm structure (5-layer article containing one closure plate and four substrate plates.).

To be in more detail, the diaphragm structure 22 employs a constitution according to the present invention. A closure plate 26 is made of a ceramic material such as zirconia and forms a diaphragm portion having a shape of a thin plate. A connecting plate 28 is made of a ceramic material such as zirconia and forms a substrate. Between these plates 26 and 28, there are positioned a ceramic connecting layer 1 made of a ceramic material such as zirconia and a spacer plate 30 which is also made of a ceramic material such as zirconia so as to form a substrate having a structure of a unitarily formed laminate. The connecting plate 28 has a plurality (three in the figure) of throughholes 32 at predetermined intervals so that the inner space connects with the outer space. The spacer plate 30 has a plurality (three in the figure) of square window portions 36 disposed at predetermined intervals in the direction along a long side of the plate. The spacer plate 30 is superposed on the connecting plate 28 so that each throughhole 32 of the connecting plate 28 matches each square window portion 36 of the spacer plate 30. Incidentally, the number of throughholes 32 for each window portion 36 is not limited to one, and more than one throughhole may be disposed depending on the use of a piezoelectric/electrostrictive film type of element 20. Further, a configuration and dimension of the throughholes 32 can be suitably selected depending on use. A closure plate 26 is also superposed on the spacer plate 30 on the surface opposite to the surface connected with the connecting plate 28. The closure plate 26 covers the openings of the window portions 36. Thus, inside the diaphragm structure are formed a plurality of pressure chambers 38 connected with outside through the throughholes 32. Incidentally, a ceramic connecting layer may be used not only between diaphragm plate and spacer plate but also between the spacer plate 30 and the connecting plate 28. The embodiment shown in FIGS. 5 and 6 has a three-layer structure consisting of a closure plate (diaphragm), a spacer plate (substrate portion), and a connecting plate (substrate portion) except for a ceramic connecting layer. However, a diaphragm structure may have more than three layers. FIG. 7 shows an embodiment having a five-layer structure.

Such a diaphragm structure 22 is formed of a predetermined ceramic material such as zirconia as described above by unitarily firing. A diaphragm portion of the diaphragm structure is protruded outside in the direction opposite to a window portion 36. Specifically, a slurry or a paste is prepared using a predetermined ceramic material, a binder, a solvent, and the like. Then, a film of a green sheet is formed using a popular apparatus for doctor blading, reverse roll coater, screen printing. As necessary, the green sheet is subjected to cutting, die cutting, or the like so as to form a window portion 36, a throughhole 32, or the like. Thus, a precursor of each plate 26, 28, 30, 1 is formed, and then the precursors are laminated and subjected to thermal press-fitting so as to obtain a unitarily laminated body. Then, the laminated body is fired to obtain a unitary diaphragm structure 22. On the other hand, a closure plate 26 forming a diaphragm portion has a protruded shape outside by the aforementioned means.

The diaphragm structure 22 is provided with piezoelectric/electrostrictive operating portions 24, each of which corresponds with each pressure chamber 38 on the outer surface having a protruded shape of a closure plate 26. The piezoelectric/electrostrictive operating portion 24 is formed by laminating a lower electrode 40, a piezoelectric/electrostrictive layer 42, and an upper electrode 44 in this order by a film forming method on the outer surface of a diaphragm portion.

Thus, the piezoelectric/elcetrostrictive operating portion 24 has two electrode films 44 and 40 and a piezoelectric/electrostrictive layer 42, which are formed on the outer surface of a closure plate 26 of a diaphragm structure 22. The diaphragm structure 22 is formed by being unitarily fired. The electrode films 44 and 40 and a piezoelectric/electrostrictive layer 42 are formed by any known method for forming a film, for example, a method for forming a thick film such as screen printing, spraying, dipping, and coating, or a method for forming a thin film such as ion beaming, sputtering, vapor deposition, ion plating, CVD, and metal plating. Any know material can be used for forming the electrode films 40 and 44 and a piezoelectric/electrostrictive layer 42. Thus formed electrode films 40 and 44 and piezoelectric/electrostrictive layer 42 form a piezoelectric/electrostrictive operating portion 24. A thickness of a piezoelectric/electrostrictive operating portion 24 is generally 100 $\mu$m or less. A thickness of an electrode 40 or 44 is generally 20 $\mu$m or less, preferably 5 $\mu$m or less. A thickness of a piezoelectric/electrostrictive layer 42 is preferably 50 $\mu$m or less, further preferably 3 $\mu$m or more and 40 $\mu$m or less so as to obtain a large displacement by a low operating voltage.

With regard to a piezoelectric/electrostrictive film element 20 in which a diaphragm structure 22 is provided with a piezoelectric/electrostrctive operating portion 24 on the diaphragm portion 26, a displacement of the diaphragm portion 26 is effectively conducted in accordance with an operation of the piezoelectric/electrostrictive operating portion 24, and a pressure chamber 38 is pressurized. As a result, a fluid in the pressure chamber 38 effectively spurts out.

In an advantageous embodiment of a diaphragm structure according to the present invention, a diaphragm portion 26 of a diaphragm structure 22 has a shape protruded outside, thereby effectively increasing a hardness of a diaphragm portion 26 provided with a piezoelectric/electrostrictive operating portion 24. Further, the mechanical strength and the natural frequency of the diaphragm portion are increased, and the corresponding speed is advantageously increased. At the same time, an impediment to the sintering of films such as a piezoelectric/electrostrictive layer 42 or the like to be formed on the outer surface of a diaphragm portion 26 can be advantageously avoided, and a strain or a stress can be efficiently changed into displacement. Even if a plurality of piezoelectric/electrostrictive operating portions 24 run at one time, an amount of displacement of each piezoelectric/electrostrictive operating portions 24 does not decrease so much in comparison with an independent running of each piezoelectric/electrostrictive operating portion 24. An amount of displacement is not influenced depending on a running form of the piezoelectric/electrostrictive operating portion 24. Therefore, an even amount of displacement is shown, and a piezoelectric/electrostrictive film element 20 has an even quality.

By the way, a thin ceramic diaphragm structure according to the present invention is advantageously used as a structural member of a piezoelectric/electrostrictive film type of element as the embodiment described above. However, there may be employed a piezoelectric/electrostrictive film type of element having a different structure from the aforementioned one. Besides speakers, sensors, vibrators, oscillators, filters, displays, and transformers, the diaphragm structure can be advantageously used as a structural member of known various applications such as a piezoelectric/electrostrictive film type actuator or the like of unimorph or a bimorph, which are used for a servo-displacement element, a pulse running motor, an ultrasonic motor, or the like, disclosed by Kenji Uchino in "Piezoelectric/Electrostrictive Actuator" edited by Japan Industrial Center and published by Morikita Publishing Company.

EXAMPLES

Then, a present invention is described with reference to Examples.

In order to obtain a diaphragm structure 22 used for a piezoelectric/electrostrictive film element 20 shown in FIGS. 5 and 6, there are prepared various kinds of ceramic materials shown in Tables 1, 2, and 3 by adding alumina to a partially stabilized zirconia powder containing 3 mol % of $Y_2O_3$. Incidentally, a very small amount of alumina accelerates sintering of zirconia, while a great amount of alumina impedes sintering of zirconia. Mullite was used for a green connecting layer of sample No. 22. Mullite and spinel were used for a green substrate of sample No. 29 and 31, respectively.

Green sheets having various kinds of thickness were formed according to a conventional method using the various kinds of ceramic materials obtained above. As necessary, the green sheets were subjected to cutting, die cutting, or the like so as to form green bodies for various kinds of closure plates 26, connecting plates 28, and spacer plates 30. The green bodies are used for forming a diaphragm structure 22 of a piezoelectric/electrostrictive film type of element 20 shown in FIGS. 5 and 6. Slurries for molding green sheets were prepared as follows:

100 volume parts of a predetermined ceramic powder, totally 60 volume parts of polyvinyl butyral resin as a binder and dibutyl phthalate as a plasticizer, a sorbitic fatty acid ester dispersant added as necessary, and 500 volume parts of a mixture consisting of 50 vol % of toluene and 50 vol % of isopropyl alcohol as a solvent were mixed with one another using a ball mill for 5–100 hours. Thus obtained slurry is subjected to removing bubbles and adjusting viscosities of 2000 mPa.s for a closure plate 26 and 20000 mPal.s for a connecting plate 28 or a spacer plate 30. Green sheets were formed by a reverse roll coater method for a closure plate 26 and by a doctor blading method for a connecting plate 28 or a spacer plate 30. A firing shrinkage rate of each green sheet was controlled by controlling a density of green compact by a mixing time using a ball mill and adding a sorbitic fatty acid ester dispersant or by controlling a highest temperature during firing. Incidentally, when a mixing time using a ball mill is long, a shrinkage rate is small. Further, a shrinkage rate becomes small by adding a sorbitic fatty acid ester dispersant. Further, when the highest temperature during firing is low, a shrinkage rate is low.

A green connecting layer is formed by a screen printing method in the interfacial portion between green sheets to be laminated so that a thickness of the connecting layer after firing becomes 6 μm. Incidentally, a paste for printing a green connecting layer was prepared by mixing 100 volume parts of a predetermined ceramic material powder, totally 110 volume parts of polyvinyl butyral resin as a binder and dibutyl phthalate as a plasticizer, 600 volume parts of acetone as a dispersion medium, and 450 volume parts of 2-ethyl hexanol with one another using a ball mill for 10 hours. Thus obtained slurry was kept at 80° C. in a vacuum drier so as to remove acetone (including 2-ethyl hexanol as a part). Thus obtained slurry was kneaded by a kneader for 30 minutes so as to obtain a paste having a viscosity of 20000–5000 mPa.s.

Thus obtained various kinds of green bodies for closure plates 26, connecting plates 28 each having a green connecting layer printed thereon, and spacer plates 30 were used for producing laminated unitary articles by laminating green bodies according to the combinations shown in Tables 1, 2, and 3 and subjecting the laminates to thermal press-fitting under the conditions of 100° C. for one minute with a pressure of 40 Kgf/cm$^2$. Incidentally, a green body for a connecting plate 28 was produced from a green sheet having the same composition as that of a green body for a spacer plate 30. (Thicknesses of both green sheets were 200 μm for a connecting plate 28 and 100 μm for spacer plate 30 after firing.) A green body for a closure plate 26 had a thickness of 10 μm after firing.

Figure 8:
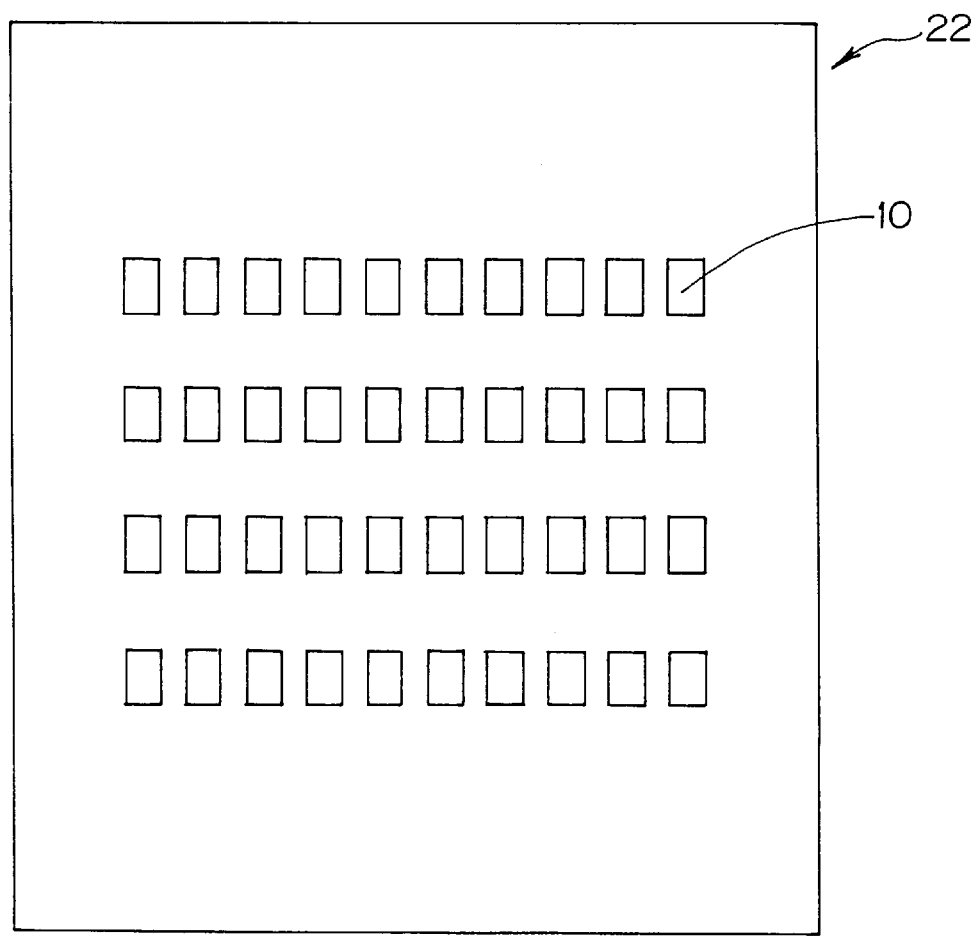
FIG. 8 is a ground plan of a diaphragm structure used for Examples.
Figure 9:
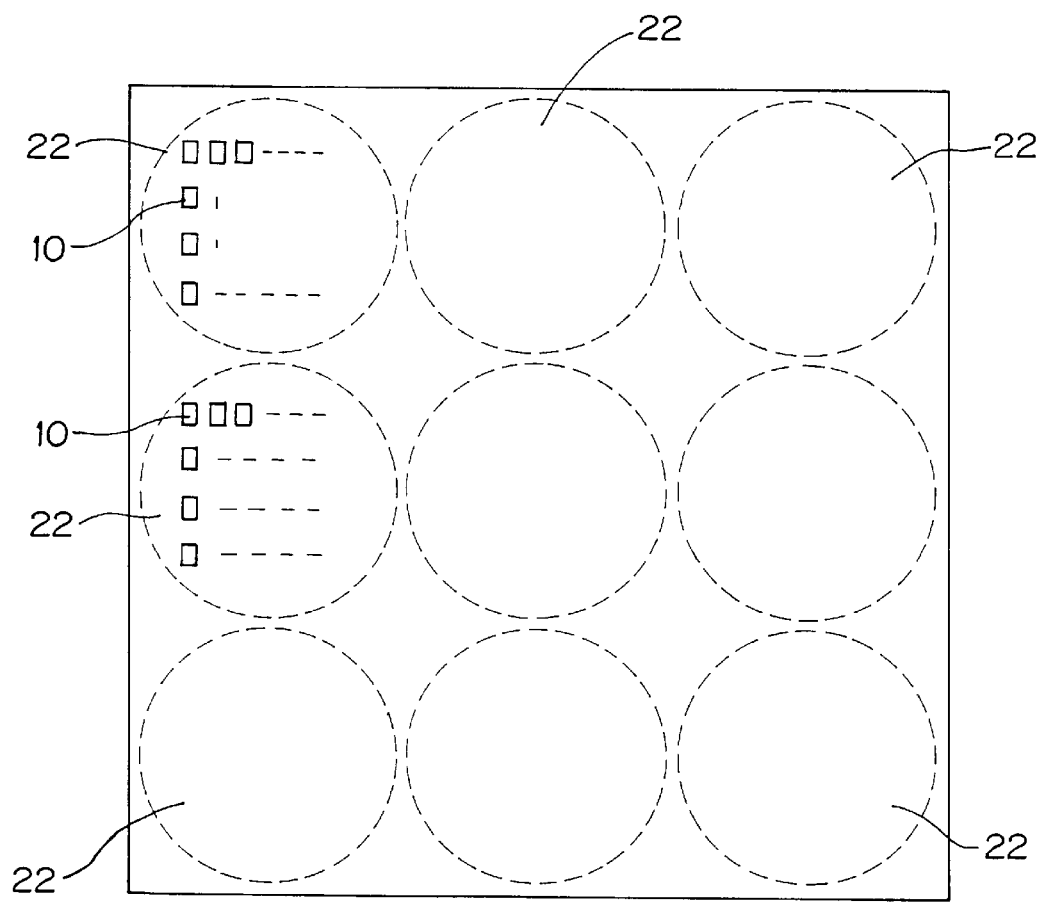
FIG. 9 is a ground plan of a substrate having nine diaphragm structures used for Examples.

Thus obtained laminated unitary bodies were kept at temperatures shown in Tables 1, 2, and 3 for three hours for firing so as to obtain various kinds of diaphragm structures 22. A configuration of a window portion 36 of a spacer plate 30 of the diaphragm structures 22, in other words, a configuration of the diaphragm is, as shown in FIG. 8, a rectangle having dimensions of 0.5×0.7 mm. Ten window portions were formed at an interval of 0.3 mm between each of the window portions in the direction of the side having a length of 0.5 mm, and four window portions were formed at intervals of 1 mm between each of the window portions in the direction of the side having a length of 0.7 mm. A diaphragm portion was measured for a rate for forming a protruded shape using a substrate having nine (3×3) diaphragm structures 22 as shown in FIG. 9. The number of evaluated points was 10×4×9=360 as shown in FIGS. 8 and 9. The results of the evaluation for the rate for forming a protruded shape are shown by X (failure), ⊚(excellent), ○(good), and Δ(fair). A diaphragm portion with the evaluation of ⊚ has the least variance of protruded amounts. The results are shown in Tables 1, 2, and 3. As obvious from the results of producing various diaphragm structures, by satisfying the conditions given by the aforementioned formulae (a), even in a substrate having a plurality of diaphragm structures each having a plurality of window portions, occurrence of depressions or cracks is effectively avoided, and protruded configurations are advantageously formed.

TABLE 1

Evaluation (1)

| Sample No. | Green sheet (diaphragm plate) Alumina (wt %) | Green sheet (diaphragm plate) A.P.D. (μm) | Green substrate Alumina (wt %) | Green substrate A.P.D. (μm) | Green connecting layer Alumina (wt %) | Green connecting layer A.P.D. (μm) | ΔT (°C.) | ΔS (%) | Substrate-connecting layer D. of S. Temp. (°C.) | Stability evaluation of protruded shape | Firing temperature (°C.) |
|---|---|---|---|---|---|---|---|---|---|---|---|
| 2  | 0.0  | 0.4  | 0.0   | 0.7  | 0.5  | 0.2 | 100 | 0   | +290 | Δ | 1600 |
| 3  | 0.5  |      |       | 0.4  |      |     |     |     | +190 | ○ | 1550 |
| 4  | 0.25 |      | 5.0   |      |      |     | 20  |     | +120 | ◉ | 1450 |
| 5  |      |      | 0.15  |      | 0.1  |     | 10  |     | +80  |   |      |
| 6  |      |      | 5.0   |      | 5.0  |     | 20  |     |      |   |      |
| 7  |      |      |       |      | 10.0 |     |     |     | +70  |   |      |
| 8  |      |      | 0.08  |      | 0.0  |     | 40  |     |      |   |      |
| 9  |      |      | 5.0   |      |      |     | 20  |     | +50  |   |      |
| 10 |      |      | 0.15  |      |      |     | 10  |     | +40  |   |      |
| 11 | 0.5  |      | 0.25  |      |      |     |     |     | +30  |   |      |
| 12 | 0.25 |      | 5.0   |      | 0.25 | 0.4 | 20  |     | +20  | Δ |      |
| 16 |      |      |       |      | 15.0 |     | 20  |     | −50  | Δ |      |
| 17 |      |      |       |      | 20.0 |     |     |     | −80  | ○ |      |
| 18 | 0.0  | 0.2  | 0.5   |      | 15.0 |     |     |     | −90  |   |      |
| 19 | 0.25 | 0.4  | 5.0   |      | 40.0 |     |     |     | −120 | ◉ |      |
| 20 | 0.5  | 0.2  | 0.25  | 0.2  | 20.0 |     | 10  |     | −180 |   |      |
| 21 |      | 0.05 | 0.5   |      | 40.0 | 1.0 | 20  |     | −340 | Δ | 1650 |

Note:
ΔT = T(substrate) − T(sheet), ΔS = S(substrate) − S(sheet).
A.P.D.: Average particle diameter
D. of S. Temp.: Difference of sintering temperature = T(substrate) − T(connecting layer)

TABLE 2

Evaluation (2)

| Sample No. | Green sheet (diaphragm plate) Alumina (wt %) | Green sheet (diaphragm plate) Average particle diameter (μm) | Green substrate Alumina (wt %) | Green substrate Average particle diameter (μm) | Green connecting layer Alumina (wt %) | Green connecting layer Average particle diameter (μm) | ΔT (°C.) | ΔS (%) | Substrate-connecting layer Difference of sintering temperature (°C.) | Stability evaluation of protruded shape | Firing temperature (°C.) |
|---|---|---|---|---|---|---|---|---|---|---|---|
| 23 | 40.0  | 0.05 | 0.5     | 1.0  | 0.15 | 0.4  | 60  | −3  | +80  | ◉ | 1600 |
| 24 | 0.05  | 0.4  | 40.0    | 0.2  | 0.5  | 0.2  |     | +6  | +140 | ○ | 1550 |
| 25 |       |      |         | 0.05 | 0.00 | 0.4  | 40  | +15 | −60  | Δ |      |
| 26 | 5.0   | 0.2  |         |      | 0.5  |      | 100 | +5  | +40  | ◉ |      |
| 27 | 0.5   | 0.5  | 0.5     | 0.7  | 15.0 | 0.7  | 150 | −10 | −90  | ○ | 1450 |
| 28 | 0.25  |      | 10.0    | 1.0  | 10.0 | 0.05 | 250 | −15 | +210 | Δ | 1550 |
| 29 | 0.5   | 0.2  | mullite*| 0.05 | 0.25 | 0.2  | 200 | +9  | +180 | ○ | 1600 |

Note:
*No alumina was added.
ΔT = T(substrate) − T(sheet), ΔS = S(substrate) − S(sheet),
Difference of sintering temperature = T(substrate) − T(connecting layer)

TABLE 3

Evaluation (Comparative Examples)

| Sample No. | Green sheet (diaphragm plate) Alumina (wt %) | Green sheet (diaphragm plate) Average particle diameter (μm) | Green substrate Alumina (wt %) | Green substrate Average particle diameter (μm) | Green connecting layer Alumina (wt %) | Green connecting layer Average particle diameter (μm) | ΔT (°C.) | ΔS (%) | Substrate-connecting layer Difference of sintering temperature (°C.) | Stability evaluation of protruded shape | Firing temperature (°C.) |
|---|---|---|---|---|---|---|---|---|---|---|---|
| 1  | 20.0 | 0.7 | 40.0    | 1.0 | 0.5  | 0.2 | 100 | 0 | +340 | x | 1650 |
| 13 | 0.5  | 0.4 | 0.25    | 0.4 |      | 0.4 | 10  |   | +10  |   | 1450 |
| 14 | 0.25 |     | 5.0     |     | 5.0  |     | 20  |   | 0    |   |      |
| 15 |      |     |         |     | 10.0 |     |     |   | −30  |   |      |
| 22 | 0.5  | 0.5 | 0.5     | 0.2 | mullite* |  |     |   | −360 |   | 1650 |

TABLE 3-continued

Evaluation (Comparative Examples)

| | Green sheet (diaphragm plate) | | Green substrate | | Green connecting layer | | Substrate-sheet | | Substrate-connecting layer | Stability | |
|---|---|---|---|---|---|---|---|---|---|---|---|
| Sample No. | Alumina (wt %) | Average particle diameter (μm) | Alumina (wt %) | Average particle diameter (μm) | Alumina (wt %) | Average particle diameter (μm) | ΔT (° C.) | ΔS (%) | Difference of sintering temperature (° C.) | evaluation of protruded shape | Firing temperature (° C.) |
| 30 | | | 0.0 | 1.0 | 0.15 | 1.0 | 360 | −10 | +140 | | 1600 |
| 31 | | 1.0 | spinel* | 0.02 | 0.0 | | 50 | +22 | −110 | | 1650 |

Note:
*No alumina was added.
Δ T = T(substrate) − T(sheet), Δ S = S(substrate) − S(sheet),
Difference of sintering temperature = T(substrate) − T(connecting layer)

As obvious from the above description, a ceramic diaphragm according to the present invention has a diaphragm portion having a shape protruded outside, thereby having advantages which could not be obtained from a conventional diaphragm having a flat shape, for example, a resonance frequency can be advantageously increased, a strength against a force from the direction opposite to the window portion is enhanced, and a sintering of a film (for example, an electrode film, or a piezoelectric/electrostrictive film) formed on the outer surface of a diaphragm portion by a thick film method or the like is not impeded. Therefore, a thin ceramic diaphragm structure having an excellent quality and a high reliability can be obtained according to the present invention. Since such a ceramic diaphragm structure is a laminate body, it can have a high cumulation. Further, since the diaphragm structure is a unitarily fired body, it has a high reliability and a high handling ability, and a shape of a diaphragm structure can be freely designed. Further, since a height of a protruded portion can be easily controlled, the productivity is high, and producing a very thin diaphragm portion can be realized.

Further, the method according to the present invention enables a production of a substrate having a plurality of ceramic diaphragm structures having an excellent characteristics as described above. This makes easier an industrial production of a ceramic diaphragm structure.

A piezoelectric/electrostrictive film element having a ceramic diaphragm structure according to the present invention enhances a high operating reliability. Therefore, such a piezoelectric/electrostrictive film element is advantageously used for actuators, displays, filters, microphones, sound generators (speakers or the like), various kinds of sensors, various kinds of vibrators, oscillators, or the like.

What is claimed is:

1. A method for producing a ceramic diaphragm structure, comprising the steps of:
   preparing a ceramic green substrate;
   forming a ceramic green connecting layer having a predetermined thickness on said ceramic green substrate;
   forming at least one window portion on said ceramic green substrate having said ceramic green connecting layer thereon;
   preparing a thin ceramic green sheet having a predetermined thickness;
   preparing a unitarily formed laminated body by laminating said ceramic green sheet on said ceramic green substrate having at least one window portion so as to cover the window portion in the side of ceramic green connecting layer; and
   firing said laminated body to obtain a unitarily sintered body in which a thin diaphragm portion is formed in a window portion of said ceramic green substrate, and simultaneously with the firing of said laminated body, said diaphragm portion is protruded in the direction opposite to said window portion.

2. A method for producing a ceramic diaphragm structure according to claim 1, wherein said ceramic green substrate, said ceramic green sheet, and said ceramic green connecting layer are adjusted so as to have a mid-sintering temperature and a shrinkage rate satisfying the formulae:

$$S(\text{substrate}) - S(\text{sheet}) \geq -0.08\{T(\text{substrate}) - T(\text{sheet})\} - 1 \quad 0 \leq T(\text{substrate}) - T(\text{sheet}) \leq 300 \quad S(\text{substrate}) - S(\text{sheet}) \leq 20$$

and $$300 \geq T(\text{substrate}) - T(\text{connecting layer}) \geq 20$$

or $$-350 \leq T(\text{substrate}) - T(\text{connecting layer}) \leq -50,$$

wherein S(substrate) and S(sheet) denote shrinkage rates (%) in the direction along the surfaces when said ceramic green substrate and said ceramic green sheet are independently fired at the same temperature as a firing temperature of said laminated body, and T(substrate), T(sheet), and T(connecting layer) denote firing temperatures (° C.) when a shrinkage rate (%) in the direction along the surface reaches 70% when said ceramic green substrate, said ceramic green sheet, and said ceramic green connecting layer are independently fired at the same temperature as a firing temperature of said laminated body.

3. A method for producing a ceramic diaphragm structure according to claim 2, wherein said ceramic green sheet comprises a material selected from the group consisting of a completely stabilized zirconia material, a partially stabilized zirconia material, alumina material and a material containing a mixture thereof, an average particle diameter of the material ranging from 0.05 to 1.0 μm.

4. A method for producing a ceramic diaphragm structure according to claim 1, wherein said ceramic green sheet comprises a material selected from the group consisting of a completely stabilized zirconia material, a partially stabilized zirconia material, alumina material and a material containing a mixture thereof, an average particle diameter of the material ranging from 0.05 to 1.0 μm.

* * * * *